United States Patent
Kanai et al.

(10) Patent No.: US 9,522,801 B2
(45) Date of Patent: Dec. 20, 2016

(54) TAPE FEEDER AND TAPE FEEDING METHOD

(71) Applicant: PANASONIC INTELLECTUAL PROPERTY MANAGEMENT CO., LTD., Osaka (JP)

(72) Inventors: Kazunori Kanai, Yamanashi (JP); Junkei Shimizu, Yamanashi (JP); Tatsuo Yamamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/417,351

(22) PCT Filed: Mar. 4, 2013

(86) PCT No.: PCT/JP2013/001328
§ 371 (c)(1),
(2) Date: Jan. 26, 2015

(87) PCT Pub. No.: WO2014/016984
PCT Pub. Date: Jan. 30, 2014

(65) Prior Publication Data
US 2015/0223372 A1    Aug. 6, 2015

(30) Foreign Application Priority Data
Jul. 27, 2012  (JP) ................. 2012-166774

(51) Int. Cl.
*B65H 20/20* (2006.01)
*B65H 20/22* (2006.01)
*H05K 13/04* (2006.01)
*H05K 13/02* (2006.01)

(52) U.S. Cl.
CPC ............ *B65H 20/22* (2013.01); *H05K 13/021* (2013.01); *H05K 13/0417* (2013.01)

(58) Field of Classification Search
CPC .......... B65H 20/20; B65H 20/22; H05K 13/02
See application file for complete search history.

(56) References Cited

U.S. PATENT DOCUMENTS

2011/0072654 A1    3/2011    Oyama et al.
2011/0243695 A1    10/2011   Hwang et al.

FOREIGN PATENT DOCUMENTS

| JP | 2011-77096 A | 4/2011 |
| JP | 2011-171664 A | 9/2011 |
| JP | 2011-211169 A | 10/2011 |

OTHER PUBLICATIONS

International Search Report for Application No. PCT/JP2013/001328 dated May 28, 2013.

*Primary Examiner* — Michael McCullough
(74) *Attorney, Agent, or Firm* — Pearne & Gordon LLP

(57) ABSTRACT

Trailing end portions and leading end portions of two carrier tapes are detected in a first detecting position P1 and a second detecting position P1 which are set along a tape traveling path 5c by a first tape detecting sensor S1 and a second tape detecting sensor S2, and a tape feeding control device 26 controls a first tape feeding mechanism 20A and a second tape feeding mechanism 20B so as to control an interval between the trailing end portion and the leading end portion based on an interval control pattern.

2 Claims, 8 Drawing Sheets

SECTIONAL VIEW TAKEN ALONG LINE B-B

TAPE FEEDER AND TAPE FEEDING METHOD

TECHNICAL FIELD

The present invention relates to a tape feeder for supplying an electronic part which is held on a carrier tape to a part absorbing position where the electronic part is absorbed by a part mounting mechanism and a tape feeding method used in the tape feeder.

BACKGROUND ART

A tape feeder is known as an electronic part supply device in a parts mounting system. This tape feeder pitch feeds a carrier tape which holds an electronic part thereon to thereby supply the electronic part to a part absorbing position where the electronic part is absorbed by a mounting head of a part mounting mechanism. As a method for keeping parts supplied continuously without interrupting the mounting operation in the tape feeder, a tape splicing method is conventionally used in which a new following carrier tape (a following tape) is spliced to a trailing end portion of a preceding carrier tape (a preceding tape) which has already been inserted in the tape feeder. In this tape splicing method, an operator needs to perform a complex and troublesome operation every time supply reels are replaced, and therefore, it has been desired to reduce this work load. This desire has resulted in the adoption of a splicing-less type, as a new tape supplying method, tape feeder in which a following tape can be set in the tape feeder without performing the tape splicing operation (refer, for example, to Patent document 1).

In the related art tape feeder described in the patent document described above, a tape feeding mechanism is disposed at a tape inserting portion which is provided at a rear end portion of the tape feeder. This tape feeding mechanism includes a sprocket with feeding pins which engage with feeding perforations in a carrier tape and a biasing means for biasing a carrier tape against the sprocket, whereby the sprocket is driven to rotate to feed the carrier tape. Then, in supplying a following tape in the tape feeder, a leading end portion of the following tape is inserted between the preceding tape which is in engagement with the sprocket and the biasing means, whereby the following tape is fed together with the preceding tape as the preceding tape is fed. Then, as a trailing end portion of the preceding tape passes through the sprocket, the following tape is brought into engagement with the sprocket so that the following tape can be fed to a downstream side.

RELATED ART DOCUMENTS

Patent Document

Patent Document 1: JP-A-2011-211169

SUMMARY OF THE INVENTION

Problems to be Solved by the Invention

In the related art including the example described in the patent document described above, however, there is a problem that the following inconvenience is caused in supplying carrier tapes in succession into the tape feeder using the splicing-less method. Namely, in the splicing-less method, since the preceding tape and the following tape are not connected together, the preceding tape and the following tape are fed individually and separately in the tape feeding process. Then, when the following tape is not supplied at an appropriate timing and the two tapes are not fed in a completely synchronized fashion, an interval is produced between a trailing end portion of the preceding tape and a leading end portion of the following tape. Then, when this interval is elongated, the mounting head has to wait to pick up a part, calling for a reduction in working efficiency. In the conventional splicing-less type tape feeder, however, no method is described for controlling the tape feeding reasonably from the viewpoint of working efficiency in feeding tapes for replenishment or supply, and hence, it has been difficult to operate the tape feeder efficiently.

Then, an object of the invention is to provide a tape feeder and a tape feeding method which enable the tape feeder to operate efficiently by controlling reasonably a tape feeding in feeding a following tape into the tape feeder for replenishment or supply in the splicing-less method.

Means for Solving the Problems

A tape feeder of the invention is a tape feeder that pitch feeds a carrier tape installed in a parts mounting system and storing an electronic part in a tape feeding direction to thereby supply the electronic part to apart absorbing position where the electronic part is to be absorbed by a mounting head, including: a tape traveling path that is provided so as to make a communicative connection from a tape introducing opening opened in an upstream end portion in the tape feeding direction to the part absorbing position and guides tape feeding of the carrier tape; a first tape feeding mechanism that is provided at a downstream side of the tape traveling path and pitch feeds the carrier tape to the part absorbing position; a second tape feeding mechanism that is provided at an upstream side of the tape traveling path and feed the carrier tape introduced from the tape introducing opening to the downstream side; a first tape detecting sensor and a second tape detecting sensor that respectively detect presence or absence of the carrier tape in a first detecting position which is set at an upstream side of the first tape feeding mechanism on the tape traveling path and a second detecting position which is set at a downstream side of the second tape feeding mechanism and an upstream side than the first detecting position; and a tape feeding control device that controls the first tape feeding mechanism and the second tape feeding mechanism, respective trailing end portions and leading end portions of a preceding tape which is fed first and a following tape which is fed to follow the preceding tape of two carrier tapes fed one after the other are detected individually by the first tape detecting sensor and the second tape detecting sensor, and the tape feeding control device controls the first tape feeding mechanism and the second tape feeding mechanism based on the results of detections of the trailing end portions and the leading end portions by the first tape detecting sensor and the second tape detecting sensor so as to control an interval between the trailing end portion and the leading end portion on the tape traveling path in a preset interval control pattern.

A tape feeding method of the invention is a tape feeding method for feeding a plurality of carrier tapes sequentially in a tape feeder that pitch feeds a carrier tape installed in a parts mounting system and storing an electronic part in a tape feeding direction to thereby supply the electronic part to a part absorbing position where the electronic part is to be absorbed by a mounting head, the tape feeder includes: a tape traveling path that is provided so as to make a communicative connection from a tape introducing opening opened in an upstream end portion in the tape feeding direction to the part absorbing position and guides tape feeding of the carrier tape; a first tape feeding mechanism that is provided at a downstream side of the tape traveling path and pitch feeds the carrier tape to the part absorbing position; a second tape feeding mechanism that is provided at an upstream side of the tape traveling path and feed the carrier tape introduced from the tape introducing opening to the downstream side; a first tape detecting sensor and a second tape detecting sensor that respectively detect presence or absence of the carrier tape in a first detecting position which is set at an upstream side of the first tape feeding mechanism on the tape traveling path and a second detecting position which is set at a downstream side of the second tape feeding mechanism and an upstream side than the first detecting position; and a tape feeding control device that controls the first tape feeding mechanism and the second tape feeding mechanism, in a process of feeding sequentially a preceding tape which is fed first and a following tape which is fed to follow the preceding tape of two carrier tapes fed one after the other along the tape traveling path, respective trailing end portions and leading end portions of the preceding tape and the following tape are detected individually by the first tape detecting sensor and the second tape detecting sensor, and by controlling the first tape feeding mechanism and the second tape feeding mechanism based on the results of detections of the trailing end portions and the leading end portions by the first tape detecting sensor and the second tape detecting sensor, an interval between the trailing end portion and the leading end portion on the tape traveling path is controlled based on a preset interval control pattern.

Advantageous Effects of the Invention

According to the invention, the trailing end portions and leading end portions of the preceding tape which is fed first and the following tape which is fed to follow the preceding tape of the two carrier tapes which are fed one after the other in the first detecting position and the second detecting position which are set in the predetermined positions along the length of the tape traveling path by the first tape detecting sensor and the second detecting sensor individually. Then, the tape feeding control device controls the first tape feeding mechanism and the second tape feeding mechanism based on the results of detections of the trailing end portions and leading end portions so as to control the interval between the trailing end portion and the leading end portion on the tape traveling path based on the preset interval control pattern. By adopting this configuration, in the splicing-less method, the tape feeding in supplying the following tape in the tape feeder can be controlled reasonably, thereby making it possible to operate the tape feeder efficiently.

MODE FOR CARRYING OUT THE INVENTION

Next, an embodiment of the invention will be described by reference to the drawings. Firstly, referring to FIGS. 1 and 2, the configuration of a parts mounting system 1 which mounts an electronic part on a substrate will be described. The parts mounting system 1 has a function to mount an electronic part such as a semiconductor chip on a substrate. FIG. 2 shows part of a section taken along the line A-A in FIG. 1.

Figure 1:
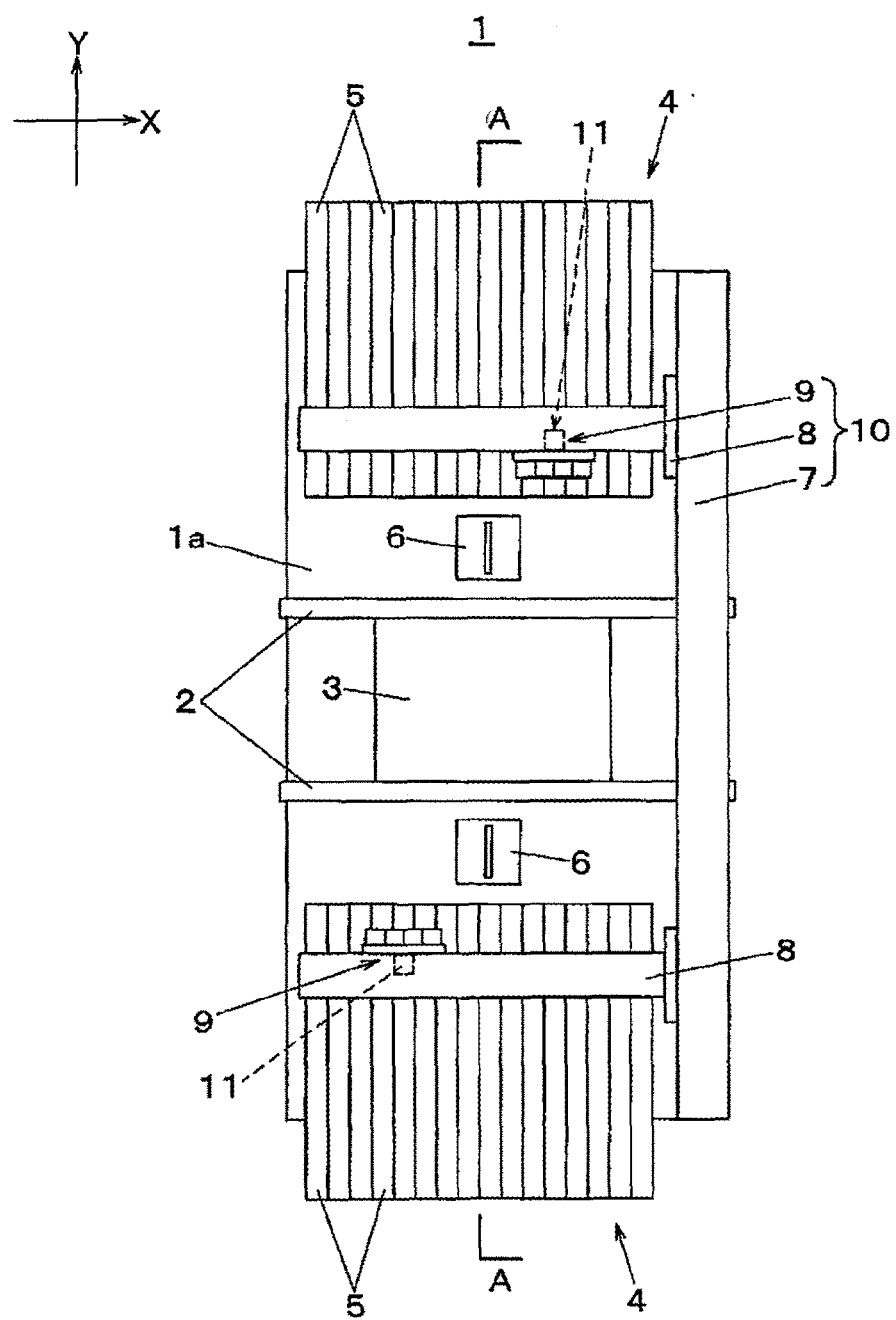
FIG. 1 is a plan view of a parts mounting system of an embodiment of the invention.
Figure 2:
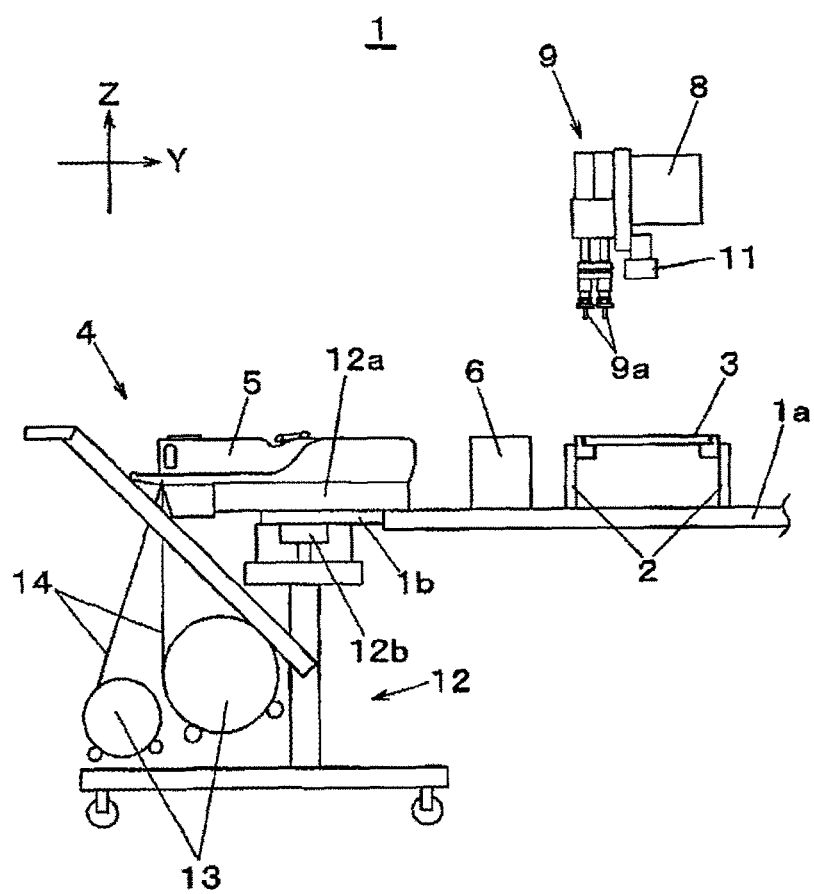
FIG. 2 is a partial sectional view of the parts mounting system of the embodiment of the invention.

In FIG. 1, a substrate conveying mechanism 2 is disposed along an X direction (a substrate conveying direction) in a center of a base table 1*a*. The substrate conveying mechanism 2 conveys a substrate 3 which is conveyed thereto from an upstream side to a mounting stage which is set to perform a part mounting operation and positions to hold the substrate thereon. Part supplying portions 4 are individually disposed on both sides of the substrate conveying mechanism 2, and a plurality of tape feeders 5 are installed side by side on each of the part supplying portions 4. The tape feeder 5 pitch feeds a carrier tape which stores an electronic part thereon in a tape feeding direction, that is, in a direction from an outside of the part supplying portion 4 towards the substrate conveying mechanism 2 to thereby supply the electronic part to a part absorbing position where the electronic part so supplied is absorbed by a mounting head of a part mounting mechanism, which will be described later.

A Y-axis moving table 7, which includes a linear driving mechanism, is disposed at one end portion of an upper surface of the base table 1*a* in the X direction, and two X-axis moving tables 8, which also each include a linear driving mechanism, are connected to the Y-axis moving table 7 so as to move freely in a Y direction. A mounting head 9 is installed on each of the two X-axis moving tables 8 so as to move freely in the X direction. The mounting heads 9 are each a multiple head which includes a plurality of holding heads, and absorbing nozzles 9*a* installed individually at respective lower end portions of the holding heads as shown in FIG. 2. These absorbing nozzles 9*a* absorb to hold an electric part and can individually be raised and lowered.

The mounting heads 9 move in the X direction and the Y direction by driving the Y-axis moving table 7 and the X-axis moving tables 8. In this configuration, the two mounting heads 9 individually pick up electronic parts from the part absorbing positions on the tape feeders 5 of the corresponding parts supply portions 4 using their own absorbing nozzles 9*a* and convey the electronic parts to mounting points on the substrate 3 which is positioned by the substrate conveying mechanism 2 so that the electronic parts are mounted thereat. The Y-axis moving table 7, the X-axis moving table 8 and the mounting head 9 make up a part mounting mechanism 10 which conveys an electronic part to mount it on a substrate 3 by moving the mounting head 9 which holds the electronic part.

Part recognition cameras 6 are disposed between the parts supply portions 4 and the substrate conveying mechanism 2. When the mounting head 9 picks up an electronic part from the parts supply portion 4 and passes over the corresponding part recognition camera 6 with the electronic part held thereon, the part recognition camera 6 captures an image of the electronic part which is held by the mounting head 9 to recognize the electronic part. A substrate recognition camera 11 is installed on each of the mounting heads 9. The substrate recognition camera 11 is positioned on a lower surface side of the X-axis moving table 8 and moves together with the mounting head 9. As the mounting head 9 moves, the substrate recognition camera 11 moves over the substrate 3 which is positioned by the substrate conveying mechanism 2 and captures an image of the substrate 3 to recognize it. In a part mounting operation in which an electronic part is mounted on a substrate 3 by the mounting head 9, the results of recognition of the electronic part by the part recognition camera 6 and the results of recognition of the substrate by the substrate recognition camera 11 are combined together to perform a mounting position correction.

As shown in FIG. 2, a trolley 12 is set at the parts supply portion 4. In this trolley 12, a plurality of tape feeders 5 are installed on a feeder base 12a in advance. The trolley 12 is positioned and fixed to the parts supply portion 4 by clamping the feeder base 12a to a fixed base 1b provided on the base table 1a using a clamping mechanism 12b. Supply reels 13 are held on the trolley 12, and the supply reels 13 hold, in a wound state, a carrier tape 14 which holds electronic parts. A carrier tape 14 which is unwound from the supply reel 13 is pitch fed to the part absorbing position where an electronic part is absorbed by the absorbing nozzle 9a by the tape feeder 5.

Figure 3:
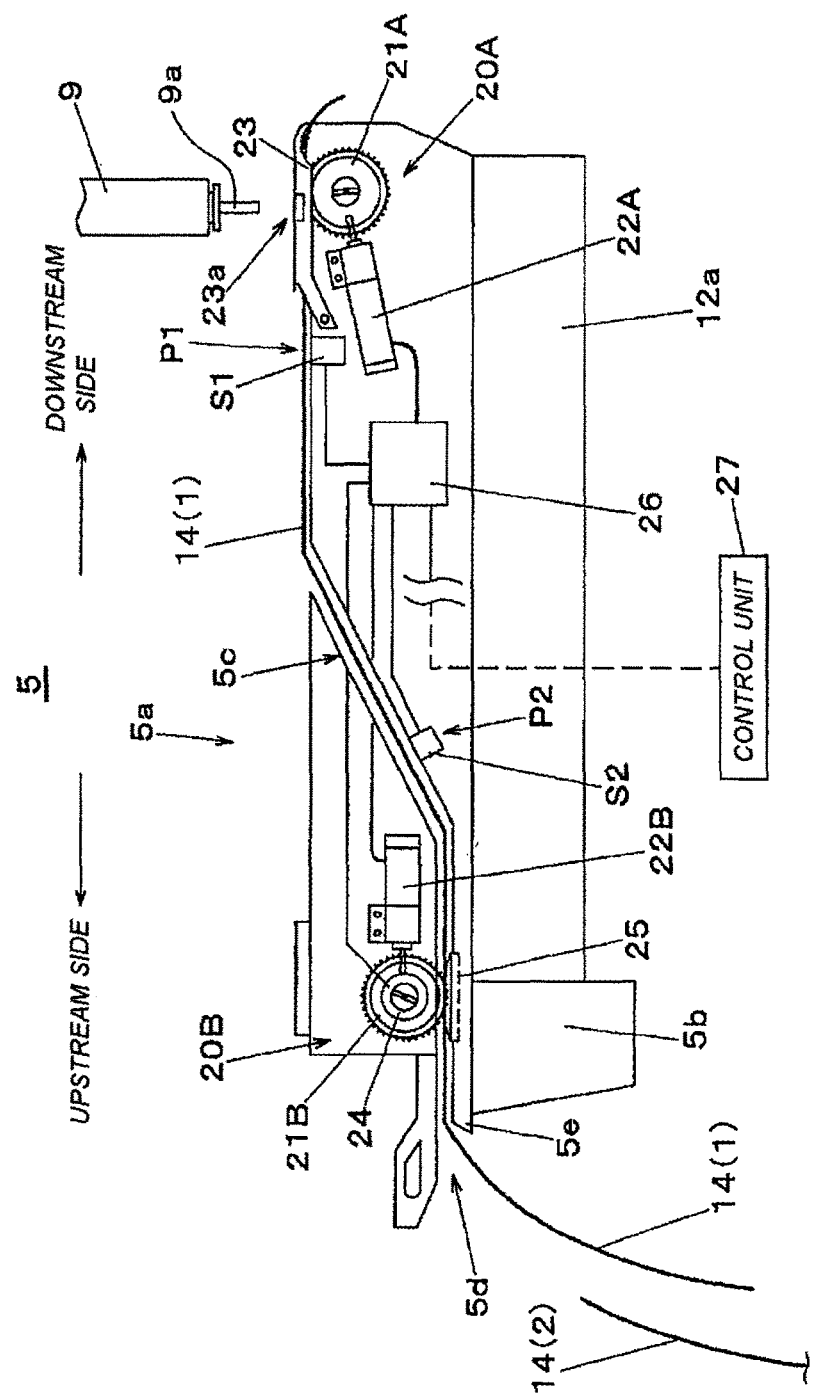
FIG. 3 is an explanatory diagram illustrating the configuration of a tape feeder of the embodiment of the invention.
Figure 4A:
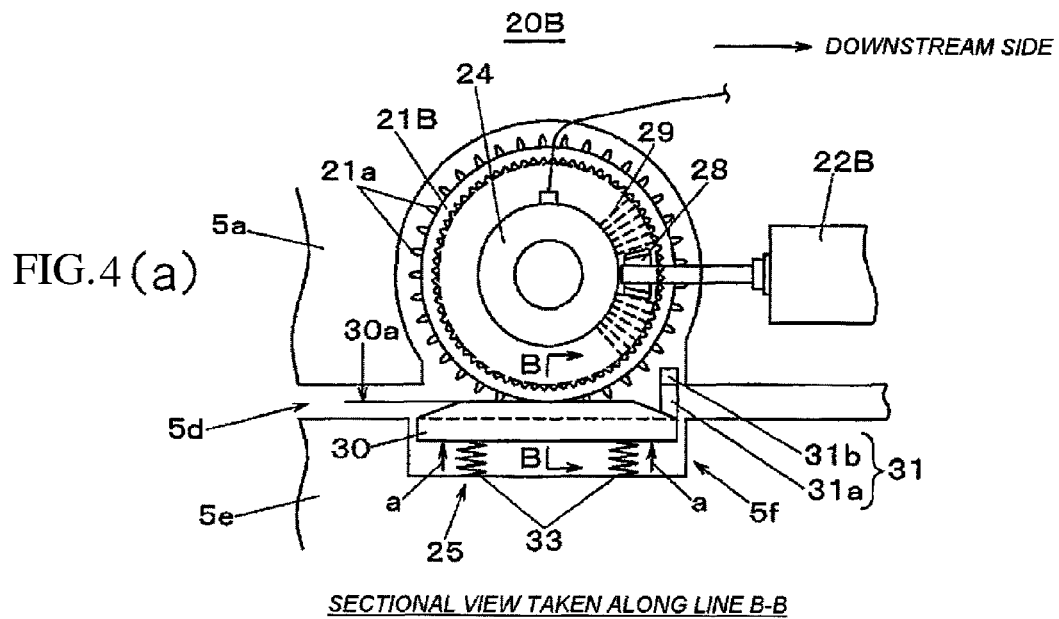
FIGS. 4 (*a*)-(*d*) are explanatory diagrams that illustrate the configuration and function of a second tape feeding mechanism of the tape feeder of the embodiment of the invention.
Figure 4B:
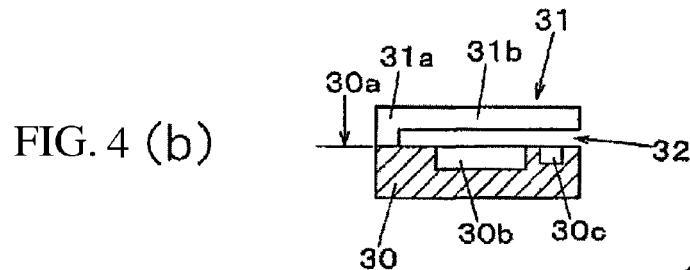
Figure 4C:
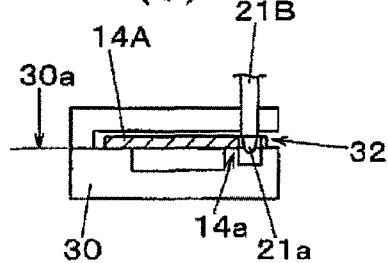
Figure 4D:
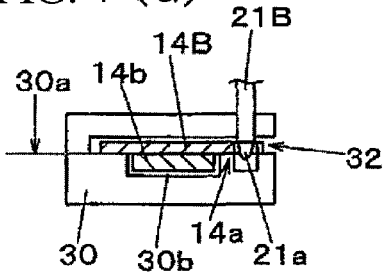

Next, referring to FIG. 3, the configuration and function of the tape feeder 5 will be described. As shown in FIG. 3, the tape feeder 5 includes a main body portion 5a and an installing portion 5b which is provided on a lower surface of the main body portion 5a so as to project therefrom. In such a state that the tape feeder 5 is installed with the lower surface of the main body portion 5a laid along the feeder base 12a, a connector portion (whose illustration is omitted) provided on the installing portion 5b fits in the feeder base 12a. With the connector portion fitting in the feeder base 12a, the tape feeder 5 is fixedly installed on the parts supply portion 4, and a tape feeding control device 26, which is incorporated in the tape feeder 5 to control tape feeding, is electrically connected to a control unit 27 of the parts mounting system 1.

A tape traveling path 5c is provided in an interior of the main body portion 5a, and the carrier tape 14 unwound from the supply reel 13 and taken into the main body portion 5a is guided along this tape traveling path 5c. The tape traveling path 5c is provided so as to establish a communicative connection from a tape introducing opening 5d which is opened between an extending portion 5e where a lower end portion of the main body portion 5a extends towards an upstream side and an upstream end portion of the main body portion 5a to the part absorbing position where an electric part is picked up by the mounting head 9. In a continuous parts mounting operation in which electronic parts are mounted in succession, a plurality of carrier tapes 14, whose unit lot is a lot that a single supply reel 13 can hold, are sequentially inserted from the tape introducing opening 5d to be supplied into the tape feeder 5.

In the parts mounting system 1 described in this embodiment, the tape splicing is not performed in which a trailing end portion of a carrier tape 14(1) which is already installed in the tape feeder 5 (hereinafter, referred to as a preceding tape 14(1)) and a leading end portion of another carrier tape 14(2) which is additionally installed in the tape feeder 5 as a result of available parts running out on the preceding tape 14(1) (hereinafter, referred to as a following tape 14(2)) are spliced together by a splicing tape. Instead, the splicing-less method is adopted in which the preceding tape 14(1) and the following tape 14(2) are inserted sequentially into the tape introducing opening 5d while they are separated from each other.

A first tape feeding mechanism 20A and a second tape feeding mechanism 20B are disposed at a downstream side and an upstream side of the tape traveling path 5c, respectively. In the first tape feeding mechanism 20A and the second tape feeding mechanism 20B, sprockets 21A, 21B are driven to rotate by motors 22A, 22B, respectively. A plurality of feeding pins 21a (refer to FIG. 4) provided on an outer circumferential surface of each of the sprockets 21A, 21B are fitted in feeding perforations 14a formed in a carrier tape 14 for engagement with the carrier tape 14. Then, when the sprockets 21A, 21B are driven to rotate with the feeding pins 21a in engagement with the carrier tape 14, the carrier tape 14 is fed.

The first tape feeding mechanism 20A which is provided at the downstream side of the tape traveling path 5c pitch feeds a carrier tape 14 to the part absorbing position where an electronic part is absorbed by the mounting head 9. A tape fastening member 23 is provided above the first tape feeding mechanism 20A, whereby a carrier tape 14 which is pitch fed by the first tape feeding mechanism 20A is guided while being fastened from thereabove by the tape fastening member 23. Then, an electronic part held on the carrier tape 14 is picked up by the absorbing nozzle 9a of the mounting head 9 through a pick-up opening portion 23a formed in the tape fastening member 23 in a position corresponding to the part absorbing position.

In addition, the second tape feeding mechanism 20B which is provided at the upstream side of the tape traveling path 5c has a function to feed a carrier tape 14 which is introduced from the tape introducing opening 5d to the downstream side. In the second tape feeding mechanism 20B, a biasing mechanism 25 for biasing a carrier tape 14 introduced from the tape introducing opening 5d against the sprocket 21B for engagement therewith is provided in the extending portion 5e in a position lying below the sprocket 21B.

A first detecting position P1 for detecting a carrier tape 14 is set in a position along the tape traveling path 5c which lies near the part absorbing position and upstream of the first tape feeding mechanism 20A. Additionally, a second detecting position P2 for detecting a carrier tape 14 is also set in a position along the tape traveling path 5c which lies downstream of the second tape feeding mechanism 20B and further upstream than the first detecting position P1. A first tape detecting sensor S1 and a second detecting sensor S2, which are disposed in the first detecting position P1 and the second detecting position P2, respectively, detect the existence of a carrier tape 14 in the first detecting position P1 and the second detecting position P2. The results of detections by the first tape detecting sensor S1 and the second tape detecting sensor S2 are transmitted to the tape feeding control device 26, whereby the tape feeding control device 26 controls based on the detection results transmitted thereto the rotation of the motors 22A, 22B, as well as the operation of a clutch mechanism 24 provided in the second tape feeding mechanism 20B, which will be described below.

In this embodiment, the first tape detecting sensor S1 and the second tape detecting sensor S2 detect individually respective trailing end portions E and leading end portions T of a preceding tape 14(1) which is fed first and a following tape 14(2) which is fed to follow the preceding tape 14(1) of two carrier tapes 14 which are fed one after the other. Then, the tape feeding control device 26 controls the first tape feeding mechanism 20A and the second tape feeding mechanism 20B based on the results of detections of the trailing end portions E and leading end portions T made individually by the first tape detecting sensor S1 and the second tape detecting sensor S2 to thereby control an interval between the trailing end portion E and the leading end portion T on the tape traveling path 5c based on a preset interval control pattern. This interval control pattern will be described in detail in FIGS. 7 and 8.

Next, the configuration and function of the second tape feeding mechanism 20B will be described by reference to Section (a) to (d) in FIG. 4, Section (a) to (c) in FIG. 5, and Section (a) to (c) in FIG. 6. As shown in Section (a) of FIG. 4, the sprocket 21B is connected to a connecting gear 29 via the clutch mechanism 24, whereby the sprocket 21B rotates in a tape feeding direction by rotationally driving a bevel gear 28 which is in mesh engagement with the connecting gear 29 by the motor 22B. Here, the function of the clutch mechanism 24 will be described. The clutch mechanism 24 incorporates a one-way clutch mechanism and an engaging and disengaging mechanism. The one-way clutch mechanism permits the sprocket 21B to idly rotate only in a first rotating direction which corresponds to the tape feeding direction in which a carrier tape 14 is fed from the upstream side to the downstream side of the tape traveling path 5c and prohibits the sprocket 21B from idly rotating in an opposite direction to the first rotating direction. The engaging and disengaging mechanism engages and disengages a connection between the connecting gear 29 and the bevel gear 28 so as to make and interrupt the transmission of drive from the connecting gear 29 to the bevel gear 28.

Figure 5:
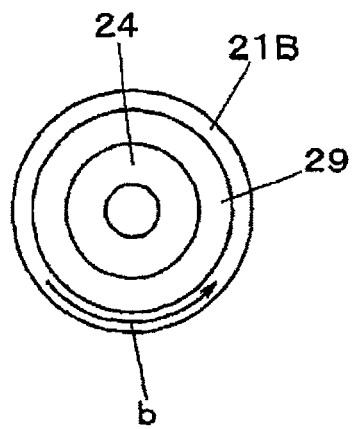
FIGS. 5 (*a*)-(*c*) are explanatory diagrams that illustrate the function of a rotational driving unit provided in the second tape feeding mechanism of the tape feeder of the embodiment of the invention.
Figure 5:
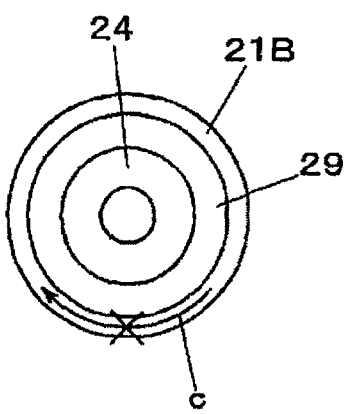
Figure 5:
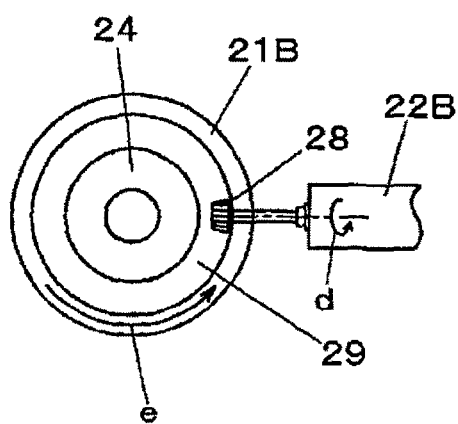

Namely, as shown in Section (a) of FIG. 5, the sprocket 21B is permitted to idly rotate in a direction indicated by an arrow b (a counterclockwise direction) which is the first rotating direction and is prohibited from idly rotating in a direction indicated by an arrow c (a clockwise direction) as shown in Section (b) of FIG. 5. In addition, as shown in Section (c) of FIG. 5, by actuating the motor 22B to rotate the bevel gear 28 in a direction indicated by an arrow d the sprocket 21B is driven to rotate in the tape feeding direction which corresponds to the first rotating direction (a direction indicated by an arrow e).

Namely, the motor 22B, the connecting gear 29 and the clutch mechanism 24 make up a rotational driving unit which operates the sprocket 21B changeably in two operation modes of an idle rotation mode in which the sprocket 21B is permitted to idly rotate in the first rotating direction and a driving mode in which the sprocket 21B is driven to rotate in the first rotating direction. Additionally, by controlling the motor 22B and the clutch mechanism 24 by the tape feeding control device 26 the operation modes are switched between the idle rotation mode shown in Section (a) of FIG. 5 and the driving mode shown in Section (c) of FIG. 5.

The biasing mechanism 25 (a biasing means) is disposed below the sprocket 21B, and this biasing mechanism 25 brings a carrier tape 14 into engagement with the sprocket 21B by biasing the carrier tape 14 against an outer circumferential surface of the sprocket 21B. In the biasing mechanism 25, a biasing member 30 which is biased upwardly by a compression spring 33 is disposed in a recess portion 5f which is provided by partially cutting the extending portion 5e. The biasing member 30 is mainly made up of a trapezoidal block member which is chamfered or tapered at upstream and downstream end portions of an upper surface thereof, and a stopper mechanism 31 is erected at the downstream end portion so as to stop a downstream movement of a carrier tape 14.

When a carrier tape 14 is inserted between the biasing member 30 and the sprocket 21B via the tape introducing opening 5d, an abutment surface 30a of the biasing member 30 which is biased upwardly (a direction indicated by arrows a) by the compression springs 33 is brought into abutment with a lower surface (a surface on a side opposite to a part-storing side) of the carrier tape 14 so as to bias the carrier tape 14 upwardly, whereby the carrier tape 14 is pressed against the outer circumferential surface of the sprocket 21B. By doing so, the feeding pins 21a fit in feeding perforations 14a formed in the carrier tape 14, whereby an engagement is made between the carrier tape 14 and the sprocket 21B. Namely, the biasing member 30 and the compression springs 33 make up the biasing means of biasing the carrier tape 14 from the opposite side thereof to the part-storing side against the outer circumferential surface of the sprocket 21B by bringing the abutment surface 30a of the biasing member 30 into abutment with the lower surface of the carrier tape 14 for engagement of the carrier tape 14 with the sprocket 21B.

Section (b) of FIG. 4 shows a sectional view taken along the line B-B in Section (a) of FIG. 4. A recess portion 30b is formed in the abutment surface 30 so as to extend along the tape feeding direction. In addition, an escape portion 30c is provided in the abutment surface 30a over a range where the feeding pins 21a would be brought into contact when the biasing member 30 approaches the sprocket 21B, so as to avoid the interference of the feeding pins 21a with the biasing member 30.

The stopper mechanism 31 which is provided at the downstream side end portion of the biasing member 30 has a function to restrict a movement of a following tape 14(2) which is inserted between the sprocket 21B and the preceding tape 14(1) in the tape feeding direction. The stopper mechanism 31 is erected at the one end portion of the biasing member 30, and a restricting portion 31b is provided, in contact with an end portion of the following tape 14(2), at an upper end of a supporting portion 31a which extends upwardly from the biasing member 30 so as to extend over the abutment surface 30a. In addition, an opening portion 32 is provided between the restricting portion 31b and the abutment surface 30a, and this opening portion 32 has such a gap that permits the traveling of only one carrier tape 14.

Section (c) and (d) of FIG. 4 show a state in which a carrier tape 14 which is to be supplied is installed on the biasing member 30. Namely, Section (c) of FIG. 4 shows a state in which a relatively thin paper tape 14A which carries a small part is installed on the biasing member 30 to be supplied. A lower surface of the paper tape 14A is supported on the abutment surface 30a, and the interference between the feeding pins 21a which fit in feeding perforations 14a formed in the paper tape 14A and the abutment surface 30a is prevented by the escape portion 30c.

In addition, Section (d) of FIG. 4 shows a state in which an embossed tape 14B having an embossed portion 14b formed on a lower surface thereof and used to hold a relatively large part is installed on the biasing member 30 to be supplied. The lower surface of the embossed tape 14B is supported on the abutment surface 30a, and the embossed portion 14b is held within the recess portion 30b. Similarly, the interference by the feeding pins 21a which fit in feeding perforations 14a formed in the embossed tape 14B and the abutment surface 30a is prevented by the escape portion 30c.

Next, a tape setting method of setting a carrier tape 14 in the tape feeder 5 will be described by reference to Section (a) to (c) in FIG. 6. Here, in a continuous parts mounting operation in which electronic parts are supplied in succession into the part mounting mechanism 10 by the tape feeder 5, the tape splicing method is not used in which a preceding tape 14(1) which is fed first and a following tape 14(2) which is fed so as to follow the preceding tape 14(1) of two carrier tapes 14 which are fed one after the other are not spliced together. Instead, the following tape 14(2) is supplied into the tape feeder 5 in such a state that the preceding tape 14(1) is in engagement with the sprocket 21B.

Figure 6:
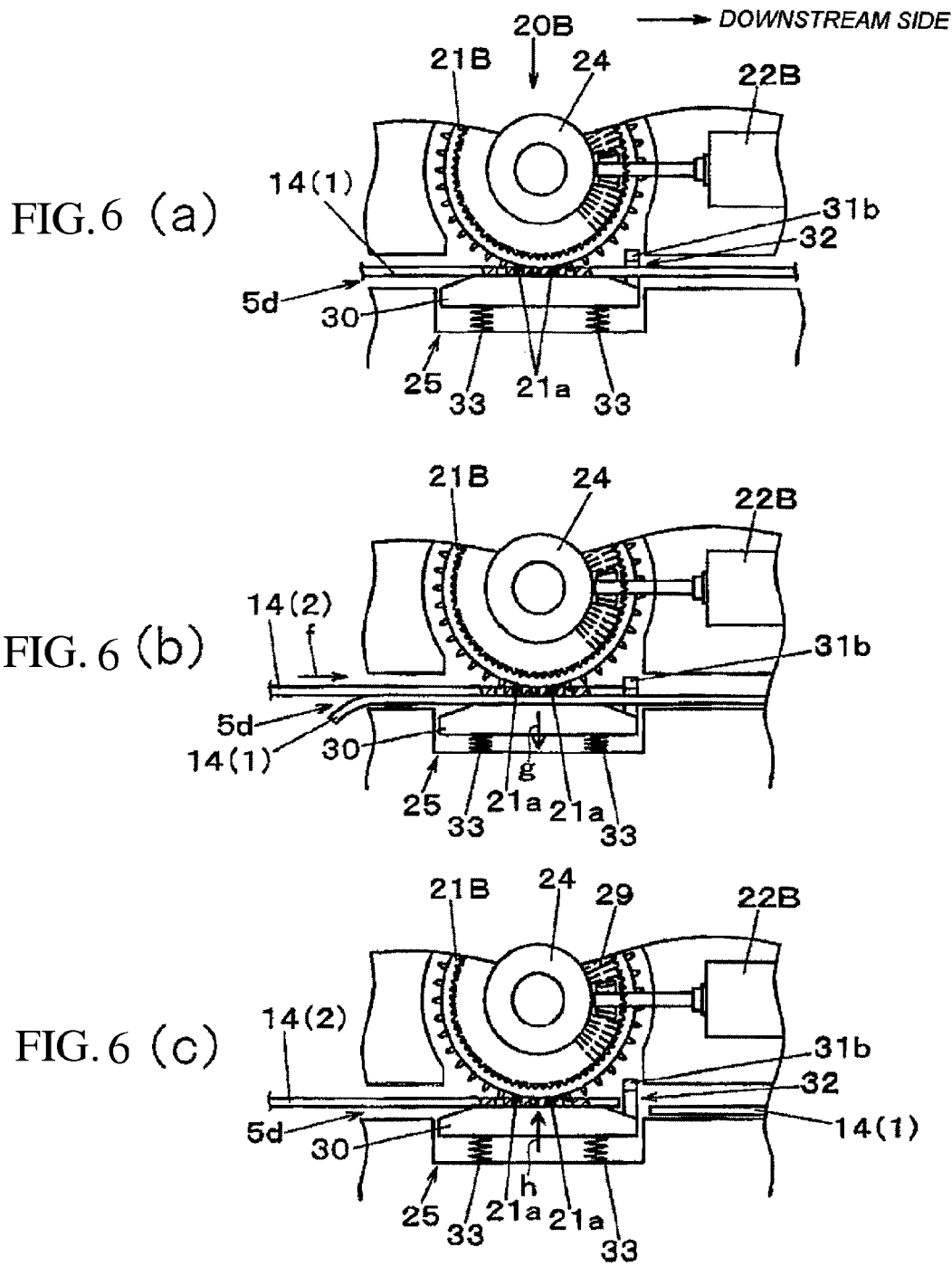
FIGS. 6 (*a*)-(*c*) are explanatory diagrams that illustrate operations of a tape setting method by the tape feeder of the embodiment of the invention.

Firstly, Section (a) of FIG. 6 shows a state in which the preceding tape 14(1) which is fed first is fed while being in engagement with the sprocket 21B and the supply of parts by the preceding tape 14(1) is performed continuously. As this occurs, the biasing member 30 biases the preceding tape 14(1) from a lower surface side thereof so that the preceding tape 14(1) is pressed against the sprocket 21B. The preceding tape 14(1) is fed, passing through the opening portion 32 without being interrupted by the restricting portion 31b which is provided at the downstream end portion of the biasing member 30. In this state, by switching the clutch mechanism 24, the sprocket 21B is permitted to idly rotate in the tape feeding direction, and the preceding tape 14(1) is freely fed by the first tape feeding mechanism 20A irrespective of the second tape feeding mechanism 20B.

Following this, when a trailing end portion of the preceding tape 14(1) approaches the tape introducing opening 5d as a result of parts having been continuously supplied, a following tape 14(2) is set additionally. Namely, as shown in Section (b) of FIG. 6, a leading end portion of the following tape 14(2) which is fed to follow the preceding tape 14(1) is inserted between the sprocket 21B and the preceding tape 14(1) (as shown by an arrow f). As this occurs, the biasing member 30 is pushed downwards by a distance corresponding to a thickness of the following tape 14(2) (as shown by an arrow g) against the biasing force of the compression springs 33, and the restricting portion 31b is lowered together with the biasing member 30 which is being pushed downwards. This positions the restricting portion 31b at a height where the restricting portion 31b prevents the following tape 14(2) from being fed towards the downstream side of the tape traveling path 5c. In this state, too, the sprocket 21 is similarly permitted to idly rotate in the tape feeding direction, whereby the preceding tape 14(1) is fed freely by the first tape feeding mechanism 20A. In addition, the following tape 14(2) comes into abutment with the restricting portion 31b at the leading end portion thereof, whereby the following tape 14(2) is being stopped.

When the preceding tape 14(1) continues to be fed in this state, the preceding tape 14(1) which is being biased by the biasing mechanism 25 configured of the compression springs 33 and the biasing member 30 is released towards the downstream side of the tape traveling path 5c from the state in which the preceding tape 14(1) is held between the sprocket 21B and the following tape 14(2) while pressing the following tape 14(2) against the sprocket 21B for engagement therewith. By doing so, as shown in Section (c) of FIG. 6, the biasing member 30 which is biased upwardly by the compression springs 33 is pushed upwardly (as indicated by an arrow h) by a distance corresponding to a thickness of the preceding tape 14(1), and the following tape 14(2) is brought into complete engagement with the sprocket 21B. As this occurs, the sprocket 21B is permitted to idly rotate in the first rotating direction which corresponds to the tape feeding direction and is prohibited from rotating in the opposite direction. Therefore, the following tape 14(2) is prevented from being dislocated upstream of the tape feeder 5.

Figure 7:
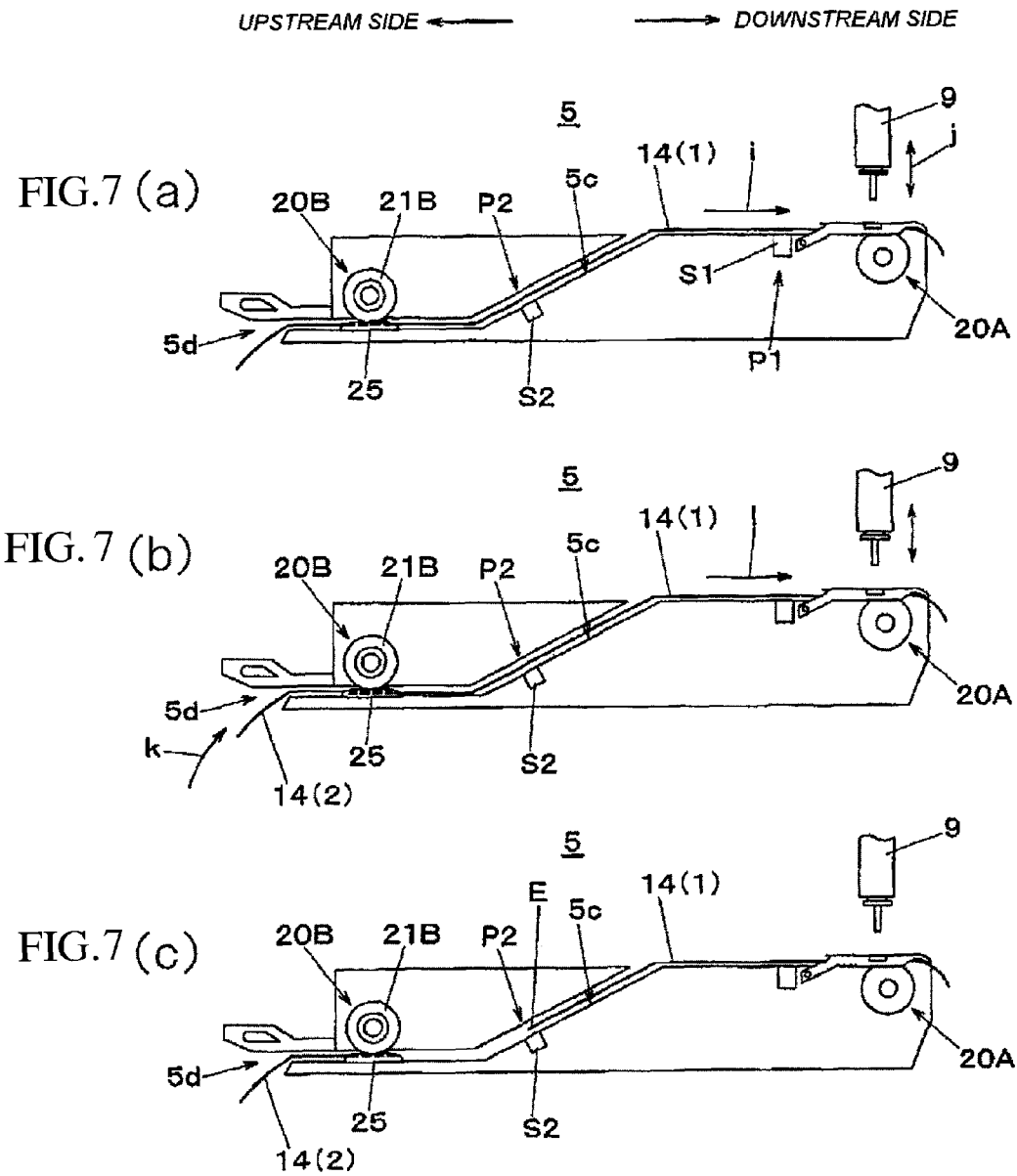
FIGS. 7 (*a*)-(*c*) are explanatory diagrams that illustrate steps in a tape feeding method adopted in the tape feeder of the embodiment of the invention.

Thereafter, when the preceding tape 14(1) is fed by the first tape feeding mechanism 20A and the second tape detecting sensor S2 disposed in the second detecting position P2 detects a trailing end portion E of the preceding tape 14(1) (refer to Section (a) to (c) of FIG. 7), the clutch mechanism 24 is switched over by the tape feeding control device 26. Namely, the operation mode of the rotational driving unit made up of the motor 22B, the connecting gear 29 and the clutch mechanism 24 is switched from the idle rotation mode to the driving mode. By doing so, the sprocket 21B is driven to rotate in the first rotating direction which corresponds to the tape feeding direction by the motor 22B, whereby the following tape 14(2) is fed.

Figure 8:
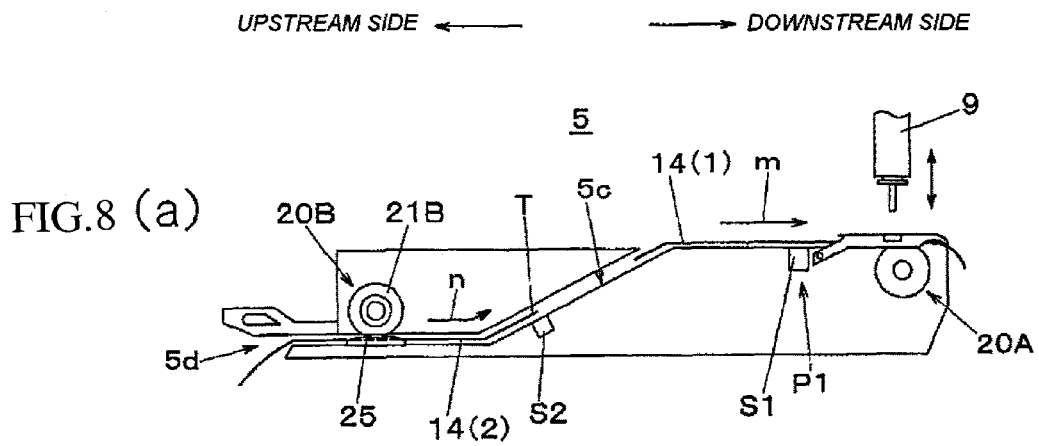
FIGS. 8 (*a*)-(*c*) are explanatory diagrams that illustrate steps of the tape feeding method adopted in the tape feeder of the embodiment of the invention.
Figure 8:
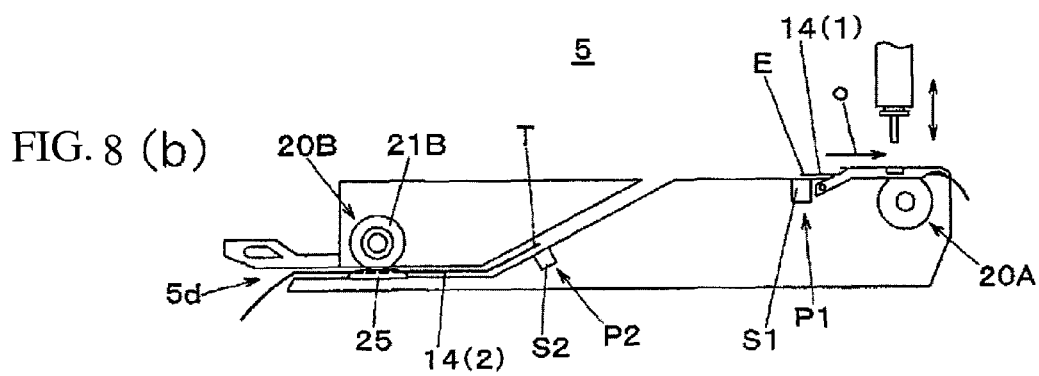
Figure 8:
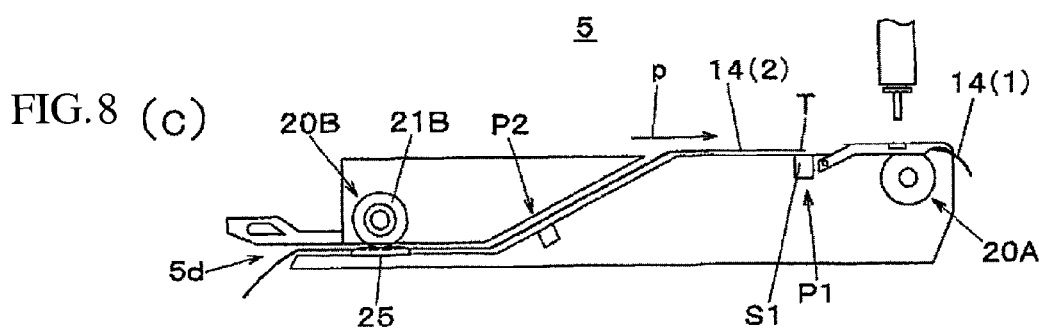

Next, referring to Section (a) to (c) of FIG. 7 and Section (a) to (c) of FIG. 8, a tape feeding method will be described in which a plurality of carrier tapes 14 are fed sequentially in the tape feeder 5. Section (a) to (c) of FIG. 7 and Section (a) to (c) of FIG. 8 show a sequential tape feeding process of feeding sequentially the preceding tape 14(1) which is fed first and the following tape 14(2) which is fed so as to follow the preceding tape 14(1) of the two carrier tapes 14 which are fed one after the other along the tape traveling path 5c.

Firstly, Section (a) of FIG. 7 shows a state in which the part mounting operation is being performed while feeding the preceding tape 14(1) along the tape traveling path 5c. Namely, the preceding tape 14(1) is inserted into the tape feeder 5 via the tape introducing opening 5d and is then fed (as indicated by an arrow i) by the first tape feeding mechanism 20A. Then, an electronic part is picked up (as indicated by an arrow j) from the preceding tape 14(1) by the mounting head 9 in the part absorbing position.

Following this, in the continuous parts mounting operation, when the parts supply from the preceding tape 14(1) approaches a final stage thereof, as shown in Section (b) of FIG. 7, the following tape 14(2) is additionally set in the tape feeder 5 for continuously supplying electronic parts. Namely, with the preceding tape 14(1) being in engagement with the sprocket 21B of the second tape feeding mechanism 20B, the leading end portion of the following tape 14(2) is introduced (as indicated by an arrow k) from the tape introducing opening 5d so as to be inserted between the sprocket 21B and the preceding tape 14(1), and the following tape 14(2) is brought into engagement with the sprocket 21B (refer to Section (b) of FIG. 6). Then, in this state, the preceding tape 14(1) is continuously fed (as indicated by an arrow l) by the first tape feeding mechanism 20A, and electronic parts are continuously picked up by the mounting head 9.

Thereafter, in the midst of feeding the preceding tape 14(1), as shown in Section (c) of FIG. 7, the trailing end portion E of the preceding tape 14(1) is detected by the second tape detecting sensor S2, and the results of the detection are transmitted to the tape feeding control device 26 (refer to FIG. 3). Then, the tape feeding control device 26 controls the first tape feeding mechanism 20A and the second tape feeding mechanism 20B based on the preset interval control pattern.

Namely, as shown in Section (a) of FIG. 8, when the trailing end portion E of the preceding tape 14(1) is detected by the second tape detecting sensor S2, the second tape feeding mechanism 20B is driven to feed the following tape 14(2) (as indicated by an arrow n) so as to move the leading end portion T of the following tape 14(2) to the second detecting position P2, and the following tape 14(2) is kept waiting in this position. Then, in this state, the preceding tape 14(1) is continuously fed (as indicated by an arrow m) by the first tape feeding mechanism 20A and electronic parts are continuously picked up by the mounting head 9.

Further, in a process of feeding the preceding tape 14(1) (as indicated by an arrow o) by the first tape feeding mechanism 20A, as shown in Section (b) of FIG. 8, when the trailing end portion E of the preceding tape 14(1) is detected by the first tape detecting sensor S1, the second tape feeding mechanism 20B is driven so as to feed the following tape 14(2) (as indicated by an arrow (p) so that the leading end portion T of the following tape 14(2) is moved from the second detecting position P2 to the first detecting position P1.

In this way, in this embodiment, by controlling the first tape feeding mechanism 20A and the second tape feeding mechanism 20B based on the results of detections of the trailing end portions E and leading end portions T made individually by the first tape detecting sensor S1 and the second tape detecting sensor S2, the interval between the trailing end portion E and the leading end portion T on the tape traveling path 5c is controlled based on the preset interval control pattern, that is, such a control pattern that prevents the interval between the trailing end portion E and the leading end portion T from exceeding an interval between the second detecting position P2 and the first detecting position P1.

By adopting this configuration, the following tape 14(2) completes its traveling to the first detecting position P1 at the timing when a final part is picked up from the preceding tape 14(1). Consequently, a situation does not occur in which parts have to remain waiting to be supplied to the mounting head 9 wastefully in refilling the tape feeder 5 with a carrier tape 14, and hence, the tape feeder 5 can be operated efficiently by controlling reasonably the tape feeding when a following carrier tape is supplied into the tape feeder 5.

Thus, as has been described heretofore, in the tape feeder and the tape setting method which are described in this embodiment, in the second tape feeding mechanism 20B which feeds a carrier tape 14 introduced from the tape introducing opening 5d to the downstream side of the tape traveling path 5c, the sprocket 21B which rotates to feed the carrier tape 14 while in engagement with the carrier tape 14 is allowed to idly rotate only in the first rotating direction which corresponds to the tape feeding direction. Further, the biasing means is provided which biases the carrier tape 14 against the outer circumferential surface of the sprocket 21B so as to bring the sprocket 21B and the carrier tape 14 into engagement with each other.

By adopting this configuration, of the two carrier tapes 14 which are fed one after the other, with the preceding tape 14(1) which is fed first remaining in engagement with the sprocket 21B, the leading end portion of the following tape 14(2) which is fed to follow the preceding tape 14(1) is inserted between the sprocket 21B and the preceding tape 14(2), and the following tape 14(2) so inserted can be brought into engagement with the sprocket 21B by biasing the preceding tape 14(1) by the biasing mechanism 25. Thus, in the splicing-less method, the following tape can be set in the tape feeder in a stable fashion by preventing the following carrier tape 14 from being dislocated upstream of the tape feeder.

In addition, in this embodiment, in the biasing mechanism 25 for biasing the carrier tape 14 from the opposite surface side to the side surface which carries parts against the outer circumferential surface of the sprocket 21B, the recess portion 30b is provided in the abutment surface 30a of the biasing member 30. By adopting this configuration, a plurality of types of carrier tapes 14 including the embossed tape 14B having the embossed portion 14b on the opposite surface to the surface which carries parts can be dealt with, thereby making it possible to enhance the versatility of the tape feeder 5.

Further, in this embodiment, of the two carrier tapes 14 which are fed one after the other, the respective trailing end portions E and leading end portions T of the preceding tape 14(1) which is fed first and the following tape 14(2) which is fed to follow the preceding tape 14(1) are detected by the first tape detecting sensor S1 and the second tape detecting sensor S2 in the first detecting position P1 and the second detecting position P2, respectively, which are set in the predetermined positions along the length of the tape traveling path 5c. Then, the tape feeding control device 26 controls the first tape feeding mechanism 20A and the second tape feeding mechanism 20B based on the results of detections of the trailing end portions E and leading end portions T so that the interval between the trailing end portion E and the leading end portion T on the tape traveling path 5c is controlled based on the preset interval control pattern. By adopting this configuration, the tape feeding can be controlled reasonably in supplying the following carrier tape into the tape feeder in the splicing-less method, thereby making it possible to operate the tape feeder efficiently.

This patent application is based on Japanese Patent Application (No. 2012-166774) filed on Jul. 27, 2012, the entire contents of which are incorporated herein by reference.

INDUSTRIAL APPLICABILITY

The tape feeder and the tape feeding method of the invention have the advantage that the tape feeding can be controlled reasonably in supplying the following carrier tape into the tape feeder in the splicing-less method, thereby making it possible to operate the tape feeder efficiently and are useful in the field of parts mounting in which electronic parts are picked up from the tape feeder to be mounted on a substrate.

DESCRIPTION OF REFERENCE NUMERALS AND SIGNS 1 parts mounting system; 3 substrate; 4 parts supply portion; 5 tape feeder; 5a main body portion; 5c tape traveling path; 5d tape introducing opening; 9 mounting head; 10 part mounting mechanism; 14 carrier tape; 14(1) preceding tape; 14(2) following tape; 20A first tape feeding mechanism; 20B second tape feeding mechanism; 21A, 21B sprocket; 21a feeding pin; 22A, 22B motor; 24 clutch mechanism; 25 biasing mechanism; 26 tape feeding control device; 29 connecting gear; 30 biasing member; 31 stopper mechanism; 31b restricting portion; 32 opening portion; S1 first tape detecting sensor; S2 second tape detecting sensor; P1 first detecting position; P2 second detecting position.

The invention claimed is:

1. A tape feeder that pitch feeds a carrier tape installed in a parts mounting system and storing an electronic part in a tape feeding direction to thereby supply the electronic part to a part absorbing position where the electronic part is to be absorbed by a mounting head, the tape feeder comprising:
   a tape traveling path that is provided so as to make a communicative connection from a tape introducing opening opened in an upstream end portion in the tape feeding direction to the part absorbing position and guides tape feeding of the carrier tape;
   a first tape feeding mechanism that is provided at a downstream side of the tape traveling path and pitch feeds the carrier tape to the part absorbing position;
   a second tape feeding mechanism that is provided at an upstream side of the tape traveling path and feed the carrier tape introduced from the tape introducing opening to the downstream side;
   a first tape detecting sensor and a second tape detecting sensor that respectively detect presence or absence of the carrier tape in a first detecting position which is set at an upstream side of the first tape feeding mechanism on the tape traveling path and a second detecting position which is set at a downstream side of the second tape feeding mechanism and an upstream side than the first detecting position; and
   a tape feeding control device that controls the first tape feeding mechanism and the second tape feeding mechanism, wherein
   respective trailing end portions and leading end portions of a preceding tape which is fed first and a following tape which is fed to follow the preceding tape of two carrier tapes fed one after the other are detected individually by the first tape detecting sensor and the second tape detecting sensor, and
   the tape feeding control device controls the first tape feeding mechanism and the second tape feeding mechanism based on the results of detections of the trailing end portions and the leading end portions by the first tape detecting sensor and the second tape detecting sensor so as to control an interval between the trailing end portion and the leading end portion on the tape traveling path in a preset interval control pattern, wherein
   in the interval control pattern, when the trailing end portion of the preceding tape is detected by the second tape detecting sensor, the tape feeding control device feeds the following tape so that the leading end portion of the following tape moves to the second detecting position and thereafter keeps the following tape waiting in this position, and
   when the trailing end portion of the preceding tape is detected by the first tape detecting sensor, the tape feeding control device controls the following tape so that the following tape is fed to move the leading end portion of the following tape from the second detecting position to the first detecting position.

2. A tape feeding method for feeding a plurality of carrier tapes sequentially in a tape feeder that pitch feeds a carrier tape installed in a parts mounting system and storing an electronic part in a tape feeding direction to thereby supply the electronic part to a part absorbing position where the electronic part is to be absorbed by a mounting head, wherein
   the tape feeder comprises:
   a tape traveling path that is provided so as to make a communicative connection from a tape introducing opening opened in an upstream end portion in the tape feeding direction to the part absorbing position and guides tape feeding of the carrier tape;
   a first tape feeding mechanism that is provided at a downstream side of the tape traveling path and pitch feeds the carrier tape to the part absorbing position;
   a second tape feeding mechanism that is provided at an upstream side of the tape traveling path and feed the carrier tape introduced from the tape introducing opening to the downstream side;
   a first tape detecting sensor and a second tape detecting sensor that respectively detect presence or absence of the carrier tape in a first detecting position which is set at an upstream side of the first tape feeding mechanism on the tape traveling path and a second detecting position which is set at a downstream side of the second tape feeding mechanism and an upstream side than the first detecting position; and
   a tape feeding control device that controls the first tape feeding mechanism and the second tape feeding mechanism,
   wherein in a process of feeding sequentially a preceding tape which is fed first and a following tape which is fed to follow the preceding tape of two carrier tapes fed one after the other along the tape traveling path, the tape feeding method comprises:
   detecting respective trailing end portions and leading end portions of the preceding tape and the following tape individually by the first tape detecting sensor and the second tape detecting sensor; and
   controlling an interval between the trailing end portion and the leading end portion on the tape traveling path based on a preset interval control pattern by controlling the first tape feeding mechanism and the second tape feeding mechanism based on the results of detections of the trailing end portions and the leading end portions by the first tape detecting sensor and the second tape detecting sensor, wherein
   the controlling step comprises:
   feeding the following tape so that the leading end portion of the following tape moves to the second detecting position and thereafter keeping the following tape waiting in this position in the interval control pattern, when the trailing end portion of the preceding tape is detected by the second tape detecting sensor; and
   feeding the following tape to move the leading end portion of the following tape from the second detecting position to the first detecting position, when the trailing end portion of the preceding tape is detected by the first tape detecting sensor.

* * * * *